Sept. 29, 1964 R. R. BETTIN 3,151,301

LINEAR RADIO FREQUENCY POWER AMPLIFIER
HAVING CAPACITIVE FEEDBACK
Filed June 16, 1960

INVENTOR.
ROGER R. BETTIN
BY Daniel D. Sharp
ATTORNEY

United States Patent Office 3,151,301
Patented Sept. 29, 1964

3,151,301

LINEAR RADIO FREQUENCY POWER AMPLIFIER HAVING CAPACITIVE FEEDBACK

Roger R. Bettin, West Webster, N.Y., assignor to General Dynamics Corporation, Rochester, N.Y., a corporation of Delaware Filed June 16, 1960, Ser. No. 36,584
3 Claims. (Cl. 330—98)

Figure 1:
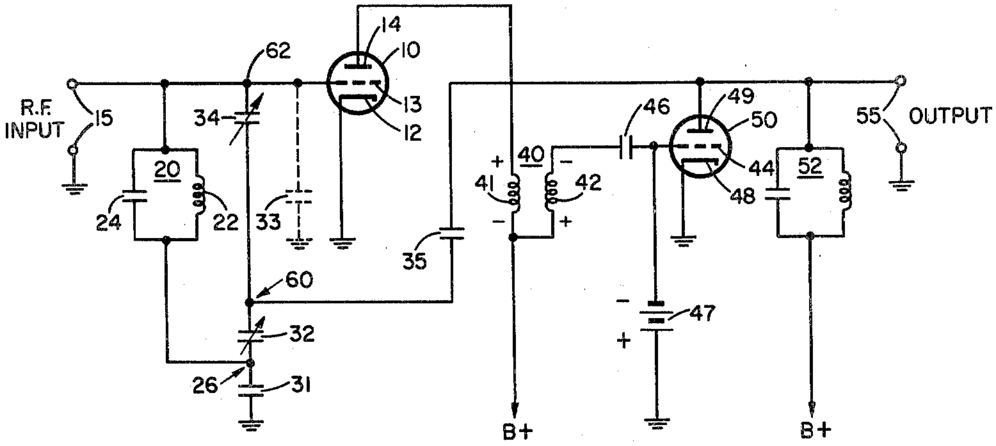

This invention relates to an amplifier and, more particularly, to a tuned radio frequency amplifier having a negative feedback circuit which substantially eliminates undesirable phase shift normally caused by the tuned input circuit of the amplifier.

As is well known, negative feedback is essential in many amplifiers, such as single-sideband power amplifiers, in order to maintain linearity amplifier response and to prevent oscillations from being generated. In amplifiers of this type, where tuned input circuits are employed to tune the amplifier over a broad operating frequency band, the phase shift introduced in the negative feedback circuit must not be appreciably affected by substantial changes in impedance in the tuned circuits. The tuned circuit in the input or grid circuit of the amplifier may, at some frequency in the amplifier passband, go into series resonance with the inherent grid plate capacitance of the amplifier; this will have a pronounced adverse affect upon the phase shift in the negative feedback loop.

Even if operation of the tuned amplifier occurs at a given frequency, it is possible that positive feedback to the tuned input circuit may occur at another frequency which would cause oscillations to occur at the other frequency. The possibility of oscillation at the spurious frequency may cause a positive feedback and obviously must be avoided.

One scheme previously designed to overcome the disadvantage of spurious oscillations involves neutralization in the cathode circuit of the output amplifier stage; that is, energy from the output circuit of the power output stage is fed back ino the cathode circuit of the driver stage. A feedback capacitor in the output circuit of the power amplifier is connected in series with a capacitor in the cathode circuit of the driver stage. These capacitors form a capacitive voltage divider network for feedback of energy from the plate of the output stage to the grid of the driver stage.

In order to obtain constant shift over the entire frequency range, which may be of the order from two to thirty megacycles, it is necessary to resort to a pure capacitive network. The equivalent resistance seen looking back into the cathode is approximately equal to the reciprocal of the transconductance of the tube. When tubes of relatively high transconductance are used, the effective resistance in the cathode circuit becomes comparatively small. This introduces an extraneous phase shift in the cathode circuit and requires that the reactance of the capacitor in the cathode circuit be relatively low so that the small effective resistance will have little effect. This means, in turn, that a large capacitance is needed for the cathode capacitor in the driver stage. Since the voltage divider must have a rather large ratio because of the corresponding large ratio between the voltage at the plate of the power output tube and the grid of the input or driver stage, the feedback capacitor forming a portion of the divider also must increase in value in proportion to the increase in value of the cathode capacitor in the driver tube. However, as the feedback capacitor becomes larger, the capacitance in the output circuit from plate to ground becomes so large as to affect the output tuned circuit of the power amplifier. With a large feedback capacitor, the large plate-to-cathode capacitance results in the gain-bandwidth product being relatively small. Because of the grid-to-cathode capacitance of the driver tube, the grid circuit is coupled to the cathode circuit. If a tuned circuit is connected in the grid circuit of the driver tube, this tuned circuit will, at some frequency, go into series resonance with the grid-to-cathode capacitance of the driver tube and will appreciably affect the feedback phase shift.

The cathode feedback circuit also has other disadvantages. For a given number of db feedback, a feedback capacitor of comparatively large size is needed in the plate circuit of the output stage, inasmuch as the cathode represents a low impedance circuit. Furthermore, the cathode cannot be grounded but must include a capacitor as part of a voltage divider network.

In accordance with the invention, a small sample of the power amplifier plate voltage is fed back to the grid or input circuit of the driver tube through a capacitive bridge circuit. The 180° phase shift between the plate voltage of the power amplifier and the grid voltage of the driver stage, necessary for linearity and distortion reduction, may be accomplished, for example, by transformer coupling between stages. One side of the bridge circuit is provided with capacitors which, together with the feedback capacitor, form a voltage divider network. One of these capacitors constitutes the inherent grid-to-cathode capacity of the driver tube. The other two arms of the bridge forming the other side of the bridge contains capacitors, the capacitance of which bear the same ratio to one another as the capacity of the two capacitors of said one side of the bridge circuit. When the bridge is balanced by proper adjustment of one or more of the capacitors, no feedback voltage exists across the respective midpoints of the two sides of the bridge. The input tuned circuit is connected in this diagonal of the bridge between these terminals. Consequently, the effect which the grid tank circuit might otherwise have upon the phase or magnitude of the feedback voltage is eliminated.

The feedback voltage appearing at the grid of the driver stage is obtained by the series capacitive divider network including the feedback capacitor and the capacitors in the aforesaid one side of the bridge and is substantially constant over the amplifier passband. Since the inherent grid-to-cathode capacity in the divider circuit is relatively small, the feedback capacitor in the output circuits of the power amplifier stage likewise may be small, for a given number of db feedback. The smaller the capacitance of the feedback capacitor, that is, the smaller the capacity between the plate and the cathode of the amplifier stage, the larger is the gain-bandwidth product of the output or power amplifier stage. Thus, the gain-bandwidth product of the amplifier is considerably greater than that of the prior art arrangement.

The grid input resistance is very large in comparison with the cathode input resistance (the reciprocal of the tube transconductance) so that a more accurate 180° phase relationship is maintained over a wider frequency range than can be achieved with the arrangement of the prior art wherein the cathode resistance shunts the capacitor in the cathode to form a phase shifting RC network. Another advantage of the amplifier in accordance with the invention is that the cathode of the input or driver stage may be grounded; whereas, the prior art arrangement requires a capacitor in the cathode circuit.

Figure 2:
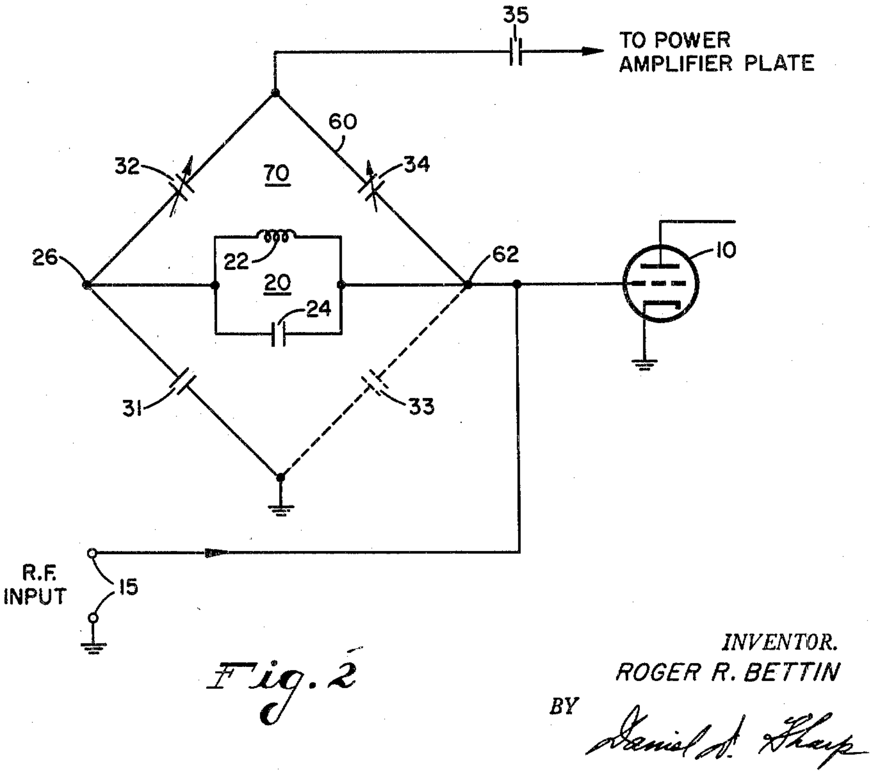

Other advantages and uses of the invention will become more apparent upon reading the following detailed specification and upon referring to the accompanying drawing, wherein:

FIG. 1 is a circuit diagram of an RF amplifier feedback circuit in accordance with the invention; and FIG. 2 is a fragmentary circuit diagram arranged to show clearly the bridge circuit in the input stage of the amplifier.

Referring now to FIG. 1, a radio frequency amplifier circuit is shown which includes a driver stage and a power amplifier stage. The driver stage is represented by a vacuum tube 10 having a grounded cathode 12 as well as a control grid 13 and an anode or plate 14. A radio frequency input signal at the input terminals 15 of the amplifier is supplied to control grid 13 of driver tube 10. A tuned circuit 20 consisting of a coil 22 connected in parallel with a capacitor 24 is provided in the input circuit of the driver stage. The tuned circuit capacitance, in some instances, may be provided by the distributed capacitance of the coil 22. One end of the tuned circuit 20 is connected to the junction point 26 of two capacitors 31 and 32, while the other end of the tuned circuit is connected to the grid 13 of tube 10. Capacitor 31 has one terminal connected to ground or some other reference potential. The inherent grid-to-cathode capacitance 33 of tube 10 is designated in broken lines and will be referred to hereafter as capacitor 33. A capacitor 34 is connected between the grid 13 and one terminal of capacitor 32. The capacitors 34, 32 and 31 consequently are connected in series between the grid 13 of tube 10 and ground.

The output circuit of the driver amplifier stage 10 extends from the plate or anode 14 by way of primary winding 41 of transformer 40 to an appropriate source of anode supply voltage. The secondary winding 42 of transformer 40 is coupled to the grid 44 of power amplifier tube 50 through a blocking capacitor 46. A suitable bias for grid 44 of tube 50 may be provided, for example, by battery 47. The cathode 48 of tube 50 may be grounded directly. The output circuit of tube 50 includes a tuned circuit 52 connected between the anode 49 of tube 50 and a source of anode voltage. Output terminals 55 are provided in the output circuit of tube 50 for connection to a suitable load, such as an antenna. Because of the phase reversal achieved in tubes 10 and 50 and in transformer 40, the voltage at plate 49 of power amplifier tube 50 is 180° out of phase with the input voltage at the grid 13 of driver tube 10. This radio frequency signal at the plate of tube 50 hence is of proper phase for negative feedback to the input of tube 10. This signal at the plate of tube 50 is coupled to the input circuit of tube 10 by means of feedback capacitor 35. The feedback capacitor forms a portion of the voltage divider network which is comprised of capacitors 33, 34 and 35 in series between the plate of the power amplifier tube 50 and ground. The grid 13 of tube 10 is connected to a tap along the voltage divider at the junction 62 of capacitors 33 and 34, whereupon the ratio of the capacitive reactance of capacitor 33 to the combined capacitive reactance of capacitors 33, 34 and 35 in series is approximately equal to the voltage ratio between the grid voltage (in shunt with capacitor 33) and the voltage at the plate of power amplifier tube 50. The interelectrode capacitance 33 of tube 10 is comparatively small, say of the order of 10 picofarads, and the capacitance of feedback capacitor 35—which is inversely proportional to the capacitive reactance of capacitor 35—can be made correspondingly small.

As is more clearly evident from FIG. 2, a conventional bridge circuit 70 is provided with capacitors 31, 32, 34, and the interelectrode capacity 33 of tube 10 in its arms. The capacitor 32 in series with capacitor 31 forms one side of the bridge, while capacitor 34 in series with capacitor 33 forms the other side of the bridge. The tuned input circuit 20 is connected in one diagonal of the bridge, that is, between the respective midpoints 26 and 62 of the two sides of the bridge. One or more of the capacitors of the bridge 70, except capacitor 33, may be made adjustable; the fact is, the adjustment of capacitors 34 or 32 have been found convenient. The important consideration is that the ratio of capacitances of capacitor 32 and capacitor 31 be equal to the capacity ratio of capacitors 34 and 33. When this condition is obtained, the bridge is balanced and no feedback voltage exists between opposite points 26 and 62 of the bridge diagonal in which the tuned circuit 20 is inserted; that is, no feedback current will flow in the tuned circuit 20 during the balanced condition. Consequently, any effect which the grid tank circuit 20 would otherwise have upon the phase or magnitude of the feedback voltage occurring at the grid 13 of tube 10 is eliminated. The actual feedback voltage appearing at the grid 10 is obtained by the capacitive divider 60 and is flat over the frequency range of operation desired.

Although the amplifier shown in FIG. 1 includes two amplification stages, the invention is not so limited. Any number of additional stages of amplification may be used provided that the necessary feedback of 180°, or odd multiple thereof, is obtained from the plate of the output stage to the grid of the input stage. If three stages of amplification are used, the correct phase may be obtained from the output circuit of the final stage to the input of the first stage without requiring any interstage transformer. However, since tuned circuits often are used in amplifiers, the use of an even number of stages together with a transformer-tuned circuitry is both feasible and practical.

The invention described herein is not limited to amplifiers using electron discharge tubes. Transistor amplifying devices may be used, provided that the proper voltage phase relations are maintained to provide negative feedback. It will be noted, for example, that common base amplifiers and common collector amplifiers are characterized by zero phase shift per stage; consequently, it would be necessary to introduce 180° phase shift, as by a transformer, to provide the proper negative feedback for linear operation.

This invention is not limited to the particular details of construction, materials and processes described, as many equivalents will suggest themselves to those skilled in the art. It is, accordingly, desired that the appended claims be given a broad interpretation commensurate with the scope of the invention within the art.

What is claimed is:

1. A linear radio frequency power amplifier comprising (*a*) a driver stage, (*b*) a power stage coupled to said driver stage, (*c*) a capacitor bridge circuit having two sides, one of said sides having as one arm thereof the inherent input capacitance of said driver stage and as the other arm thereof another capacitor, (*d*) a tuned input circuit connected diagonally across said bridge between said one side and the other of said two sides thereof, (*e*) said power amplifier stage having a tuned output circuit, (*f*) a feedback capacitor connecting said tuned output circuit across said one side of said bridge, and (*g*) said feedback capacitor having a capacitance of the same order of magnitude as said inherent capacitance.

2. A linear radio frequency power amplifier comprising (*a*) a driver stage including an electron device having input, output and control elements, (*b*) a power stage also including an electron device also having input, output and control elements, said power stage control element being coupled to said driver stage output element, (*c*) a capacitor bridge having two sides, one of said sides including a capacitor connected to said driver stage control element and the inherent capacitance presented between said driver stage control element and said driver stage input element, (*d*) a tuned input circuit connected across a diagonal of said bridge between said two sides, (*e*) means including a feedback capacitor connecting one side of said bridge between said input and output elements of said power stage device, and (f) said feedback capacitor having a capacitance of the same order of magnitude as said inherent capacitance.

3. A linear radio frequency power amplifier comprising (a) a driver tube having a grid, a plate, and a cathode, (b) a power tube also having a grid, a plate, and a cathode, (c) a transformer coupling said power tube grid to said driver tube plate, (d) a capacitor bridge including two sides, one of said sides including a first capacitor connected to said driver tube grid and the inherent grid to cathode capacity of said driver tube, the other of said sides including a pair of capacitors having the same ratio of capacity as said first capacitor and said inherent capacity, (e) a tuned circuit connected across the diagonal of said bridge between said two sides, and (f) a feedback capacitor connecting said one side of said bridge between said power tube cathode and plate, and the capacity of said feedback capacitor being of the same order of magnitude as said inherent capacity.

References Cited in the file of this patent

UNITED STATES PATENTS

| | | |
|---|---|---|
| 1,762,186 | Minnium | June 10, 1930 |
| 1,764,564 | Hull | June 17, 1930 |
| 1,787,950 | Miller | Jan. 6, 1931 |
| 1,896,500 | Wheeler | Feb. 7, 1933 |
| 2,407,074 | Green | Sept. 3, 1946 |
| 2,890,292 | Winkel | June 9, 1959 |

FOREIGN PATENTS

| | | |
|---|---|---|
| 93,263 | Netherlands | Jan. 15, 1960 |